US 6,645,850 B2

(12) United States Patent
Leuschner et al.

(10) Patent No.: US 6,645,850 B2
(45) Date of Patent: Nov. 11, 2003

(54) SEMICONDUCTOR DEVICE HAVING CAVITIES WITH SUBMICROMETER DIMENSIONS GENERATED BY A SWELLING PROCESS

(75) Inventors: Rainer Leuschner, Mohegan Lake, NY (US); Egon Mergenthaler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/230,753

(22) Filed: Aug. 29, 2002

(65) Prior Publication Data

US 2003/0049914 A1 Mar. 13, 2003

(30) Foreign Application Priority Data

Aug. 29, 2001 (DE) .......................... 101 42 224

(51) Int. Cl.$^7$ .......................... H01L 21/4763

(52) U.S. Cl. .......................... 438/624; 438/623; 438/725; 148/DIG. 73

(58) Field of Search .......................... 438/622–624, 438/703, 725, FOR 355, FOR 438; 148/DIG. 73

(56) References Cited

U.S. PATENT DOCUMENTS

| 5,599,745 | A | | 2/1997 | Reinberg |
| 5,668,398 | A | | 9/1997 | Havemann et al. |
| 5,783,481 | A | | 7/1998 | Brennan et al. |
| 5,869,880 | A | | 2/1999 | Grill et al. |
| 6,001,705 | A | * | 12/1999 | Zombrano .......... 438/421 |
| 6,165,890 | A | | 12/2000 | Kohl et al. |
| 6,251,798 | B1 | | 6/2001 | Soo et al. |
| 6,268,277 | B1 | | 7/2001 | Bang |

FOREIGN PATENT DOCUMENTS

| DE | 197 47 559 A1 | 5/1999 |
| GB | 2 330 001 A | 4/1999 |
| WO | WO 97/39484 | 10/1997 |
| WO | WO 00/51177 | 8/2000 |

OTHER PUBLICATIONS

M. B. Anand et al.: "NURA: A Feasible, Gas–Dielectric Interconnect Process", 1996 *Symposium on VLSI Technology Digest of Technical papers*, 1996, pp. 82–83.
J.G. Fleming et al.: "Use Of Air Gap Structures To Lower Intralevel Capacitance", *Proceedings of* 1997 *DUMIC Conference*, Feb 10–11, 1997, pp. 139–145.
B. Shieh et al.: "Air–Gap Formation During IMD Deposition to Lower Interconnect Capacitance", *IEEE Electron Device Letters*, vol. 19, No. 1, Jan. 1998, pp. 16–18.
Tetsuya Ueda et al.: "A Novel Air Gap Integration Scheme for Multi–level Interconnects using Self–aligned Via Plugs", 1998 *Symposium on VLSI Technology Digest of Technical Papers*, 1998, pp. 46–47.
Jung–Kyun Hong et al.: "The effect of sol viscosity on the sol–gel derived low density $SiO_2$ xerogel film for intermetal dielectric application", *Thin Solid Films*, No. 332, 1998, pp. 449–454.
Ben Shieh et al., "Air gaps lower k of interconnect dielectrics", *Solid State Technology*, Feb. 1999, pp. 51–58.

* cited by examiner

*Primary Examiner*—George Fourson
*Assistant Examiner*—Thanh Pham
(74) *Attorney, Agent, or Firm*—Laurence A. Greenberg; Werner H. Stemer; Ralph E. Locher

(57) ABSTRACT

A method creates structured cavities with submicrometer dimensions in a cavity layer of a semiconductor device. A processing material that incorporates a swelling agent is deposited on ridges of a working layer that is constructed of ridges and trenches. The processing material expands over the trenches during swelling; and covered cavities thus emerge from the trenches.

23 Claims, 3 Drawing Sheets

SEMICONDUCTOR DEVICE HAVING CAVITIES WITH SUBMICROMETER DIMENSIONS GENERATED BY A SWELLING PROCESS

BACKGROUND OF THE INVENTION

Field of the Invention

The present invention relates to a method for creating cavities that are structured in submicrometer dimensions in a cavity layer of a semiconductor device by incorporating a swelling agent in a swellable processing material. The invention further relates to a configuration produced by the method, with cavities that are structured in submicrometer dimensions in a semiconductor device.

Inside a semiconductor device, conductive tracks are capacitively coupled to one another both within an interconnect layer (intralevel) and between different interconnect layers (interlevel). Such capacitive coupling between conductive tracks leads to crosstalk and prolonged signal transit times.

In order to minimize these disruptive effects, the conductive tracks are decoupled from one another as much as possible by minimizing the capacitance between them. Given a defined spacing between two conductive tracks, this requires an optimally low permittivity of the material between the conductive tracks. Gaseous substances such as air have an almost optimal permittivity of near 1 at normal pressure, whereas the permittivity of solid bodies is usually substantially higher.

For this reason, in semiconductor devices it is generally desirable to decouple two tracks from one another by air-filled cavities. The known methods for creating such air gaps will be described below. All the methods presume a working layer that has already been structured by ridges and trenches.

Conductive tracks can functionally emerge from the ridges of the working layer. The trenches of the working layer are cavities that are not yet covered. Accordingly, an interconnect layer is one possible embodiment of a cavity layer that emerges from a working layer, but not the only one.

According to a first method, the trenches are filled with porous materials such as xerogels or aerogels and then covered with a dielectric cover layer. The air that is trapped in the pores lowers the overall permittivity of the material between the tracks. Such porous materials are in the evaluation phase at present. The disadvantages of these methods are the water absorption owing to the capillary effect of the open-pored structures, and the relatively long processing times.

Furthermore, filling the cavities with xerogels and aerogels raises the permittivity of the cavity relative to a pure air fill. The utilization of aerogels as dielectric materials with low permittivity is described in the reference titled "The Effect of Sol Viscosity on the Sol-Gel Derived Low-Density $SiO_2$ Xerogel Film For Intermetal Dielectric Application" (*Thin Solid Films*, vol. 332, pp. 449–454, 1998).

A second method is to cover trenches by conventional $SiO_2$-CVD-processes (CVD=chemical vapor deposition) with a high deposition rate.

A first variant of such a method is described in the reference titled "Air-Gap Formation During IMD Deposition to Lower Interconnect Capacitance" (B. P. Shieh, IEEE Electron Device Letters, vol. 19, no. 1, pp. 16–18, January 1998). However, gaps that are generated in this fashion extend into the $SiO_2$ cover layer (cap formation). In subsequent CMP processes, the underlying cavities can be opened, and neighboring conductive tracks can be shorted by a subsequent metallization in the open cavities. If the $SiO_2$ layer is deposited with sufficient thickness to prevent a subsequent opening of the cavities, then the problem of contacting underlying tracks by way of sufficiently deep vias arises.

In a variant of the method that is described in the reference titled "Novel Air Gap Integration Scheme for Multi-Level Interconnects Using Self-Aligned Via Plugs" (T. Ueda, Symp. on VLSI Technology, pp. 46, 47, June 1998), the covering of the trenches is a two-stage process. In a first stage, $SiO_2$ is deposited on the horizontal surfaces of the ridges with a plasma enhanced chemical vapor deposition (PECVD) method. Narrow trenches are thus covered by $SiO_2$ that grows on both sides of the trenches on the surfaces of the ridges. In a high-density plasma CVD process, wider trenches are then filled with $SiO_2$ and narrow trenches are sealed with $SiO_2$.

According to a third method as described in the reference titled "Use of Air-Gap Structures to Lower Intralevel Capacitance" (J. G. Fleming, E. Roherty-Osmum, Proc. DUMIC, pp. 139–45, 1997), spin-on materials are employed for covering the cavities between the tracks. The disadvantage of the method is the backflow of the materials into the cavities.

A fourth method is described in International Patent Disclosure WO 97/39484 A1 (Rosenmayer, Noddin). A film is laid on the interconnect layer that is structured by trenches and ridges. Such a film has a thickness of at least several micrometers, so that it can be safely processed. This gives rise to large spacings between the interconnect planes as described above, with the described disadvantages in connection with through-contacting by use of vias.

A fifth method, described in U.S. Pat. No. 6,165,890 (Kohl), is the retropolymerization of polynorbornene, which temporarily fills the cavities between the interconnects. In the method, unavoidable residues of the retropolymerization can lead to clusters that pose a short-circuiting risk. Furthermore, the selection of the dielectric material between interconnect layers is limited, because the material must be permeable to the volatile substances that emerge in the retropolymerization.

Similar disadvantages arise in a sixth method, the thermal decomposition of a temporary filling of the cavities between the conductive tracks. An example of a thermal decomposition of a temporary filling with a photoresist is described in U.S. Pat. No. 5,668,398 (Havemann). The oxidation of a temporary carbon layer is described in the reference titled "NURA: A Feasible Gas Dielectric Interconnect Process" (M. B. Anand, M. Yamada, H. Shibata, Symp. on VLSI Technology, pp. 82, 83, June 1996). In both cases, the substances that emerge in the decomposition must be expelled through the cover layer, which limits the material selection. The undecomposable residues in the cavities raise the permittivity, thereby reducing the resistance to shorting. According to another known example of the decomposition of a temporary filling, which is described in International Patent Disclosure WO 00/51177 (Werner, Pellerin), the cover layer is perforated prior to the decomposition of the filling in order to accelerate and thus improve the expulsion of the decomposition residues.

According to a seventh method, described in U.S. Pat. No. 5,599,745 (Reinberg), a dielectric layer is deposited on the ridges that are formed by the conductive tracks, this is melted enough that the layer arches over the track, and arches of the cover layer of closely adjacent tracks ultimately touch, bridging the trenches between them.

An eighth method for generating air gaps is described in U.S. Pat. No. 6,251,798 (Soo et al.). Here, in a first step a plasma-polymerized methyl silane is deposited on a structure having metal ridges such that it also fills the intermediate spaces between the metal ridges. The layer of plasma-polymerized methyl silane over the metal ridges is cured in sections by exposure. The plasma-polymerized methyl silane over the intermediate spaces between the metal ridges is partly covered during exposure, so that channels containing uncured plasma-polymerized methyl silane are formed from the surface to the spaces between the metallized ridges, which spaces are filled with uncured plasma-polymerized methyl silane. In a subsequent etching step, the uncured plasma-polymerized methyl silane is selectively etched against the cured plasma-polymerized methyl silane. It is thus removed also from the spaces between the metallized ridges by way of the channels.

The disadvantage of the method is that the curing must be adapted to the thickness of the deposited plasma-polymerized methyl silane layer. Furthermore, the plasma-polymerized methyl silane layer must be provided with a thickness of at least some 500 nanometers in order to achieve sufficient mechanical stability of the layer.

Similarly, according to a ninth method, described in U.S. Pat. No. 6,268,277 (Bang), spaces between metallized ridges are etched through channels that are provided in a cover layer. But such techniques already require cover layers that are sufficiently stable even in a perforated condition. Besides, the photolithographic processes which are needed for constructing the etch channels in the cover layer must manage smaller structural dimensions than are needed for constructing the ridges in the cavity layer. Because the cover layer must furthermore contain a layer thickness of several 100 nanometers, the etch channels are also relatively long given a small diameter, and thus etching residues remain in the formed cavities.

In a tenth method for forming air gaps, a polyimide is deposited surface-wide on a layer that has been structured by trenches and ridges. In a subsequent processing step, an additional dielectric material is deposited on the polyimide. The dielectric material is deposited in a first step at a temperature at which significant out-gassing from the polyimide occurs. With the out-gassing, cavities form between the polyimide layer and the overlying dielectric material. But the spaces between the metallized ridges cannot be realized as even close to completely empty cavities with this rather simple method that requires no further structuring measures. This method is described in U.S. Pat. No. 5,783,481 (Brennan).

The article titled "Air Gaps Lower K Of Interconnect Dielectrics" (Ben Shieh, Krishna Saraswat, Mike Deal, Jim McVittie, Solid State Technology, February 1999) contains a summary of known methods for generating air gaps in a semiconductor substrate, together with an appraisal of the results they achieve.

To summarize, the disadvantages of the described methods are rooted in:
a) residues in the cavities, which raise the permittivity and/or diminish the resistance to shorting;
b) the required thickness of the layer covering the trenches and the associated difficulty in realizing vias; and
c) the process integration.

SUMMARY OF THE INVENTION

It is accordingly an object of the invention to provide a semiconductor device having cavities with submicrometer dimensions generated by a swelling process which overcomes the above-mentioned disadvantages of the prior art methods of this general type, in which structured cavities with submicrometer dimensions can be created in a cavity layer of a semiconductor device with the aid of materials and methods that are common in semiconductor processing technology. The cavities should be free of residues, and the thickness of a layer that covers the cavity layer should not exceed one micrometer.

With the foregoing and other objects in view there is provided, in accordance with the invention, a method for creating structured cavities in a cavity layer of a semiconductor device. The method includes providing a base layer and depositing a working layer formed from a working material at least in sections on the base layer. The working layer is initially in the form of a compact working layer. A processing layer is deposited on the working layer resulting in a double-layer containing the working layer and the processing layer. The processing layer contains at least one active processing sublayer having a swellable processing material. The double-layer is structured and results in ridges with submicrometer dimensions being formed and with trenches being formed between the ridges. The ridges are formed from the working material and are covered by the swellable processing material. A processing liquid containing a swelling agent that can be incorporated into the swellable processing material, is provided. An incorporation of the swelling agent into the swellable processing material is controlled, and results in the swellable processing material of the ridges swelling, and consequently the trenches between adjacent ones of the ridges being covered and defining cavities there beneath. The processing residues are then removed from the cavities.

In the inventive method, an initially compact working layer is deposited on a base layer. The working layer is formed either exclusively of the working material (homogenous working layer) or of the working material and an auxiliary material (prestructured working layer).

The prestructured working layer is formed of first portions containing the working material and, between the first portions, second portions containing the auxiliary material.

A processing layer is deposited on the working layer, so that a double layer composed of the working layer and the processing layer emerges.

The processing layer can be composed of a homogenous layer of the processing material or of several processing sublayers. But in any case it contains at least one active processing sublayer containing a swellable processing material. The active processing sublayer preferably lies directly on the working layer.

The double layer containing the processing and working layers is then structured. There emerge ridges formed of the working material, which are covered at least by the processing material, and between the ridges, trenches. The ridges and trenches have submicrometer dimensions.

In a prestructured working layer, the ridges emerge from the first portions, which are formed from the working material, and the trenches emerge from the second portions, which are formed of the auxiliary material.

Next, a processing liquid is applied to the processing material, which contains a swelling agent that can be incorporated through the processing material.

A swelling of the processing material is then controlled. The processing material expands owing to the incorporation of the swelling agent.

The expansion of the processing material also occurs parallel to the base layer. Layers of the processing material on-neighboring ridges expand toward one another, covering the trenches between them.

The swelling process is interrupted as soon as the expanding overhanging processing material covers trenches with a width of less than a maximum cover width. Trenches with a width larger than the maximum cover width remain open and are filled later.

Cavities emerge upon the covering of the trenches and the removal of the processing residues from the trenches.

The base layer is advantageously constructed as an etch stop layer which is resistant to the etching of the working layer. The material of the working layer can be completely removed in etched portions without having to make further demands on a process control, for instance with respect to controlling the etching period. This simplifies the structuring of the working layer.

The material of the working layer is advantageously a conductive material such as copper, in order to construct the cavity layer as an interconnect layer.

On the other hand, if the cavity layer is intended for a capacitive decoupling of two interconnect layers, then a dielectric material with low permittivity is selected as the material of the ridges.

The trenches in the working layer reach the base layer, in order to achieve an optimally high overall permittivity between neighboring ridges that are constructed as conductive tracks.

The structuring of the double layer containing the compact working layer and the processing layer can be performed in various ways.

A first method starts with a compact, homogenously developed working layer with a processing layer on it. In a first step, the processing layer is structured, and in a second step, the structure of the processing layer is imaged into the working layer.

A second method for structuring the double layer of the working and processing layers starts with a compact working layer that is prestructured from the working material and an auxiliary material by the customary technique. First portions containing the working material and, between these, second portions which are formed of the auxiliary material have already been developed in the prestructured working layer. At the surface of the working layer opposite the base layer, the working layer contains a working surface, which is formed in sections from the surfaces of the first and second portions of the working layer.

The processing layer is then structured such that it remains in residual portions on portions of the working layer by the surfaces of the first portions, which are formed from the working material. The processing layer is removed from the second portions of the surface of the working layer, which is formed from the auxiliary material.

In both methods, in order to structure the double layer of the working and processing layers, the processing layer is advantageously provided in the form of an active processing sublayer containing a swellable processing material, and a passive, non-swellable processing sublayer. The active processing sublayer lies on the working layer, and the passive processing sublayer lies on the active processing sublayer.

The structuring is performed by applying, exposing and developing an auxiliary photoresist.

In the second method for structuring the double layer of the working and processing layers, the auxiliary photoresist is structured as defined by the prestructured working layer.

Here, residual portions of the auxiliary photoresist remain on portions of the processing layer surface which is opposite the working layer, which portions are opposite the first portions (which are formed from the working material) of the working layer.

The auxiliary photoresist is removed from portions of the processing layer surface which is opposite the working layer, which portions are situated opposite the second portions (which are formed from auxiliary material) of the working surface.

Advantageously, the etch resistance of the residual portions of the auxiliary photoresist is reinforced prior to the imaging of the structure of the auxiliary photoresist into the processing layer, so that they are not used up prematurely.

The structure of the auxiliary photoresist is then imaged into the processing layer.

The passive processing sublayer is an amorphous hydrocarbon which protects the active processing sublayer during the developing of the overlying auxiliary photoresist and/or inhibits a subsequent swelling of the active processing sublayer in a vertical direction perpendicular to the base layer.

The residual portions of the auxiliary photoresist are advantageously used up during the imaging of the structure of the processing layer into the working layer.

Otherwise, the residual portions of the auxiliary photoresist are flood-lit and stripped.

With the above described methods and variants, a structure with submicrometer dimensions containing ridges and trenches is generated in the working layer. The ridges bear caps formed of the material or materials of the processing layer.

Proceeding from such a structure of at least double-layer ridges on the base layer, a swelling of the processing material is controlled in the next stage of the inventive method.

The swelling of the processing material involves the incorporation of a swelling agent in the entire volume of the processing material, in contrast to the growing of material at a surface. The swelling is interrupted as soon as the expanding processing material on neighboring ridges covers intermediate trenches whose width is less than a maximum cover width.

Trenches whose width is greater than the maximum cover width remain open.

The capacitive coupling of two conductive tracks that are developed from ridges is dependent on the permittivity of the material separating the tracks and the spacing of the tracks from one another. Given a greater spacing of the tracks, a higher permittivity of the material between the tracks can be allowed in order to achieve the same capacitive coupling.

Given a large spacing of neighboring ridges, to the extent that trenches are not covered by expanding processing material and are filled with a material of low permittivity, there is no disadvantage to such open structures in practice.

After the actual swelling is interrupted, the swollen condition of the processing material is stabilized; i.e., the incorporated swelling agent is fixed in the swollen processing material.

The fixing process can be carried out by covalent or non-covalent bonds. Sufficient fixing may be achieved with the aid of Van der Waals forces by lowering the temperature after the incorporation of the swelling agent.

But the swelling agent can also be fixed by a chemical reaction. A salt can be developed, for instance in a neutralization reaction, so that the swelling agent is fixed in the structure of the processing material by ionic interactions. In this case, the processing material contains a polymer containing acid or base groups.

Lastly, the swelling agent can also be fixed in the structure of the processing material by covalent bonds. For this purpose, the processing material includes a polymer containing reactive groups that can react with a corresponding reactive group in the swelling agent and form a covalent bond. Reactive groups in the polymer of the processing material are, for example, acid anhydride groups, particularly carboxylic acid anhydride groups, epoxides, isocyanate groups, or halogenides which act as leaving groups. Corresponding, mostly nucleophilic groups are provided at the swelling agent. An amino group or hydroxy group is suitable, for example.

In a first variant of the inventive method, the material of the processing layer is a material that is swellable, stabilizable in the swollen state, and pyrolizable below a first temperature.

The first temperature is advantageously a temperature that is achieved during a subsequent processing step that is otherwise necessary for processing the semiconductor device, for instance the deposition of copper (Cu plating).

Cavities that are covered by a processing layer of a pyrolizable material are expanded into a layer covering the cavity layer by the thermal decomposition of the processing layer, which improves the capacitive decoupling of interconnect layers that are developed from cavity layers.

In a second variant of the inventive method, the processing material is a polymer that is swellable, stabilizable in a swollen state, and curable below a second temperature.

Materials such as those contained in photoresist can be used as the processing materials.

In a preferred variant of the method, the processing material has a polyimide prestage. Polymers of this type can be cured in a heating step, for example.

The processing material advantageously contains compounds with carboxylic acid or sulfonic acid groups. These groups can bond amines in the form of ammonium salts, for example, by ionic interaction. A polyimide prestage with such acid groups is sold by Toray, for instance.

Materials with phenolic groups are also suitable processing materials. The phenolic groups have an acid proton and therefore possess a higher reactivity. For instance, they can react with silazanes, whereby a group containing silicon is bound to the polymer by way of an ether group. Novolacs are suitable processing materials with phenolic groups.

Resists containing anhydride are particularly suitable as processing materials. These can be processed from an alcoholic-water medium. Such resists are sold commercially as CARL resists. The carboxylic acid anhydride group can react with amines to form a carboxylic acid amide, for example. In a heating step, these carboxylic acid amides are converted into polyimides, which have good dielectric material characteristics.

It is particularly advantageous when the swelling agent is a silylating agent, such as is utilized for post-reinforcing a photoresist (see European Patent EP 03 95 917 B1). These silylating agents react with the processing material rapidly and produce good volume growth.

The expelling of the processing residues from the cavities occurs by heating the semiconductor device to a third temperature, whereby the processing residues are driven through the processing layer in a gaseous form.

The expulsion of the processing residues from the cavities and a possible curing of a polymer that forms the processing layer advantageously occur together at the same temperature.

A cover layer containing a dielectric material with a low permittivity can be deposited on the polymerized processing layer (which is typically only 20–200 nm thick) in the next processing stage. The dielectric material is advantageously an organic dielectric material. This can be polybenzoxazole, polyaryl ether, hydrogen silsesquioxane, a fluorinated organic silica CVD film or a fluorinated or non-fluorinated hydrocarbon. Vias can then be etched into the double layer of the polymerized processing layer and the cover layer (which is composed of an organic dielectric material) in the same way in one processing step.

Silicon dioxide is also a suitable material for the cover layer.

A semiconductor device that has near ideal cavities in a cavity layer is generated with the inventive method. The cavities have the lowest possible permittivity. Conductive tracks that are developed from ridges that adjoin such cavities are decoupled from one another to the greatest possible extent.

Accordingly, the subject matter of the invention relates to a semiconductor device. The semiconductor device contains a base layer, a cavity layer on the base layer and has a structure with submicrometer dimensions, a working material and cavities. A polymerized processing layer lies on the ridges, which has a thickness of less than 100 nm and which covers the cavities.

In an advantageous variant of the inventive semiconductor device, the ridges are formed of a conductive material, particularly of copper.

The configuration can be expanded by a cover layer with a low permittivity that lies on the polymerized processing layer. Owing to the low permittivity of the cover layer, a first interconnect layer which is developed from the cavity layer is decoupled from a second interconnect layer which is subsequently disposed over the cover layer.

The cover layer advantageously is formed of an organic dielectric material, so that the cover layer and the processing layer can be processed in a common working step, for instance during the-subsequent creation of vias.

Other features which are considered as characteristic for the invention are set forth in the appended claims.

Although the invention is illustrated and described herein as embodied in a semiconductor device having cavities with submicrometer dimensions generated by a swelling process, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
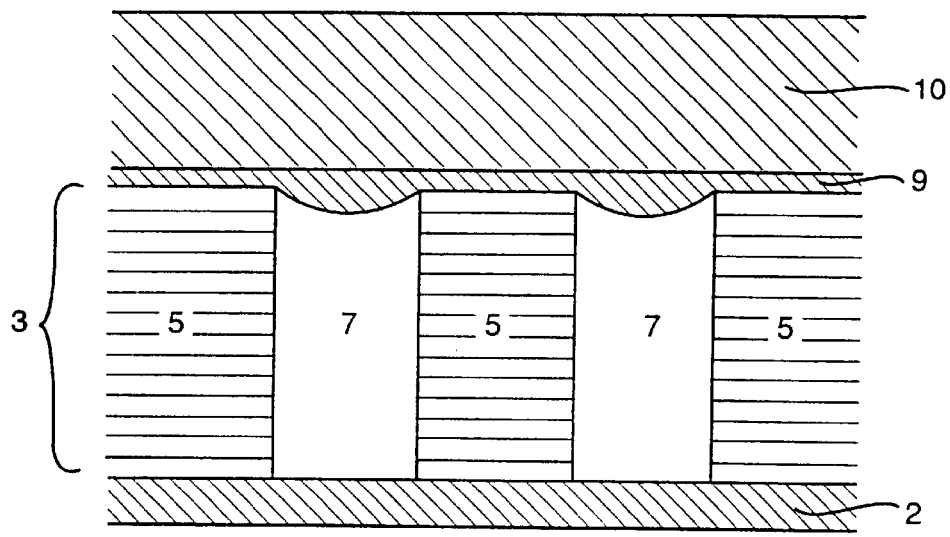
FIG. 1 is diagrammatic, cross-sectional view through a section of a configuration according to invention.

Referring now to the figures of the drawing in detail and first, particularly, to FIG. 1 thereof, there is shown in a sectional view an exemplifying embodiment of a structure having a cavity layer 3 formed of three parallel ridges 5 of a conductive material and two intermediate cavities 7. The cavities 7 are sealed at the bottom by a base layer 2 and at the top by a polymerized processing layer 9. In the exemplifying embodiment, a cover layer 10 of an organic dielectric material is located on the processing layer 9. The ridges 5 and the cavities 7 have submicrometer dimensions. The processing layer 9 has a thickness between 40 and 100 nm.

Figure 2A:
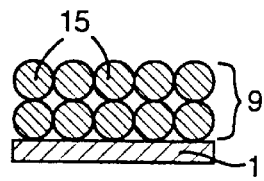
FIGS. 2A–2C are side-elevational views of a swelling process.
Figure 2B:
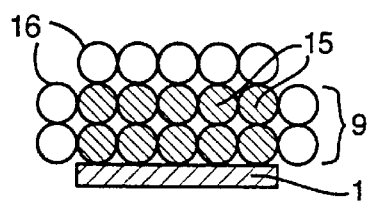
Figure 2C:
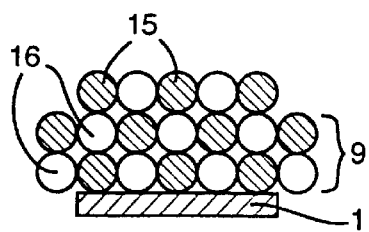

FIGS. 2A–2C schematically represents a swelling process that characterizes the inventive method in contradistinction to a method employing a growth of material on a layer surface.

FIG. 2A represents the processing layer 9 of a processing material on a working layer 1. The processing layer 9 is initially formed exclusively from portions 15.

FIG. 2B represents the processing layer 9 on the working layer 1 after new portions 16 of a second material have grown on surfaces of the processing layer 9 that are formed by the portions 15.

FIG. 2C represents the processing layer 9 on the working layer 1 after the new portions 16 have been embedded (incorporated) in the entire volume of the processing layer 9 between the portions 15 by the swelling technique characterizing the inventive method.

FIGS. 3A–3G represent the inventive method in a first variant, whereby the working layer 1 is deposited on the base layer 2 as a compact, homogenous working layer 1 of a working material.

Figure 3A:
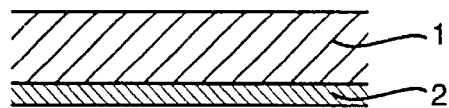
FIGS. 3A–3G are sectional views showing steps of a first embodiment of a method according to the invention.

FIG. 3A shows the homogenous working layer 1 deposited on the base layer 2.

An active processing sublayer 11 of a swellable processing material, a passive processing sublayer 12 of an amorphous hydrocarbon (a-C(H)-layer), and an auxiliary photoresist 14 are deposited on the working layer 1 surface-wide in succession.

Figure 3B:
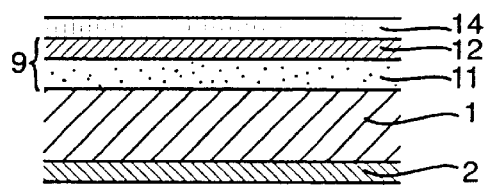

A layer system as represented in FIG. 3B emerges, which is formed of the base layer 2, the working layer 1, the active processing sublayer 11, the passive processing sublayer 12, and the auxiliary photoresist 14. The auxiliary photoresist 14 is structured by a lithographic method, whereby residual portions of the auxiliary photoresist 14 remain on the passive processing sublayer 12.

Figure 3C:
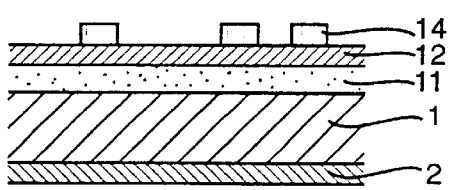

FIG. 3C represents the layer system with a structured auxiliary photoresist 14.

An etch resistance of the auxiliary photoresist 14 is then strengthened. In the next step, the structure of the auxiliary photoresist 14 is imaged into the two processing sublayers 11, 12. To this end, the uncovered portions of the processing sublayers 11, 12 are etched away, for instance with a plasma.

Figure 3D:
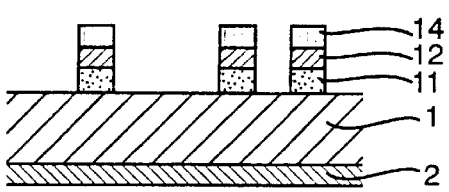

FIG. 3D represents the layer system after the processing sublayers 11, 12 are structured. The residual portions of the auxiliary photoresist 14 cover residual portions of the processing sublayers 11, 12.

Next, the structure of the processing sublayers 11, 12 is imaged into the working layer 1, whereby ridges 5 form under the residual portions of the processing sublayers 11, 12, and trenches 6 emerge between the ridges 5.

The residual portions of the auxiliary photoresist 14 are subsequently removed.

Figure 3E:
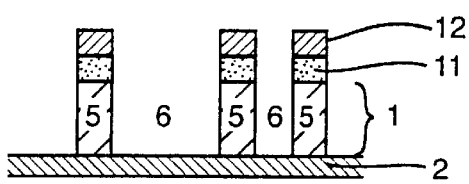

FIG. 3E shows the layer system after the structuring of the working layer 1 and the removal of the auxiliary photoresist 14. In the working layer 1, the ridges 5 have emerged, and between the ridges 5, are the trenches 6.

The structure on the base layer 2 is composed of the ridges 5 formed of the working material, which are covered with double-layer caps containing the swellable processing material of the active processing sublayer 11 and the material of the passive processing sublayer 12, and the trenches 6 between the ridges 5.

The layer system is covered at least up to the top edge of the active processing sublayer 11 by a processing liquid 8 containing a swelling agent.

The processing material incorporates the swelling agent across surfaces of the active processing sublayer 11 which are vertical relative to the base layer 2 and which are clear subsequent to the structuring, so that the active processing sublayer 11 advantageously expands there.

Figure 3F:
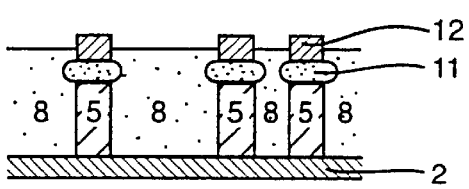

As represented in FIG. 3F, the processing material of the active processing sublayer 11 begins to expand parallel to the base layer 2 and to cover adjoining trenches 6 beginning at the surfaces of the ridges 5. The residual portions of the passive processing sublayer 12 thereon initially inhibit a swelling in the vertical direction, i.e. perpendicular to the base layer 2. The swelling agent that participates in the swelling process is contained in the processing liquid 8.

Figure 3G:
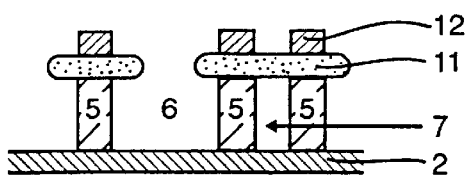

As represented in FIG. 3G (right), the trenches 6 with a width of less than a maximum cover width are covered. The processing liquid 8 is removed from the cavities 7 that emerge during the covering of the trenches 6 in that it is expelled in gas form through the expanded portions of the active processing sublayer 11. As indicated by the hatchings in FIG. 3G, residues of the residual portions of the passive processing sublayer 12 can still lie on the expanded portions of the active processing sublayer.

Expulsion is accomplished by a subsequent heating step wherein the expanded processing material is simultaneously cured.

A relief as represented in FIG. 1 emerges, formed of the base layer 2, the ridges 5, and the uncovered trenches 6 as well as expanded portions of the active processing layer 11, on which relief the cover layer 10 formed of a dielectric material is deposited in a following step, as represented in FIG. 1.

Uncovered trenches 6 are thus filled with the dielectric material 10 of the cover layer 10.

FIGS. 4A–4G show a second variant of the inventive method, whereby the working layer 1 is deposited as a compact, prestructured working layer on the base layer 2, and the swelling of the processing material in a solution is controlled.

Figure 4A:
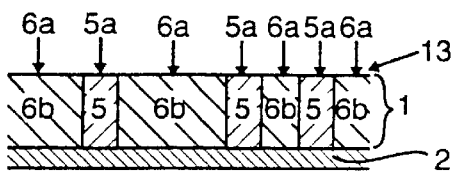
FIGS. 4A–4G are sectional views of steps of a second embodiment of the method.

FIG. 4A represents an initially still compact prestructured working layer 1 which is deposited on the layer 2. First portions 5 formed of the working material and, between these, second portions 6b formed of an auxiliary material are provided in the working layer 1, in submicrometer dimensions, respectively. On the surface of the working layer 1 opposite the base layer 2, a working surface 13 is constructed, which is formed in sections from surfaces 5a of the first portions 5 and surfaces 6a of the second portions 6b.

Figure 4B:
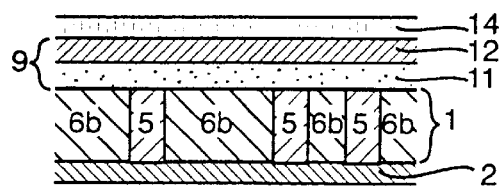

The active processing sublayer 11 of a swellable processing material, the passive processing sublayer 12, for instance of an amorphous hydrocarbon (a-C(H)-layer), and the auxiliary photoresist 14 are deposited on the working surface 13 surface-wide in succession. A layer system emerges as represented in FIG. 4B.

The auxiliary photoresist 14 is structured in a lithography process. The structuring is performed in such a way that residual portions of the auxiliary photoresist 14 remain on portions of the processing layer surface 9 opposite the surfaces 5a that are formed from the first surfaces 5 of the working layer 1. The auxiliary photoresist 14 is removed from the sections of the surface of the processing layer 9 opposite the second portions 6b of the working layer 1, which are formed from the auxiliary material.

Figure 4C:
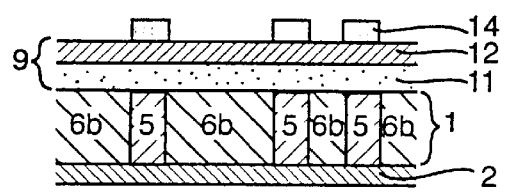

FIG. 4C represents the layer system with the photoresist 14 that has been structured as described above.

The etch resistance of the auxiliary photoresist 14 is then strengthened, and the structure of the auxiliary photoresist 14 is imaged onto the two processing sublayers 11, 12 by etching.

Figure 4D:
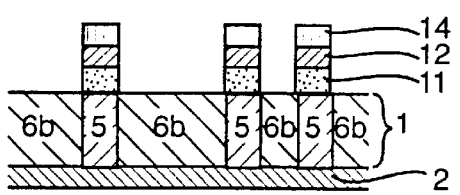

FIG. 4D represents the layer system after the structuring of the processing sublayers 11, 12. The residual portions of the auxiliary photoresist 14 cover residual portions of the processing sublayers 11, 12.

Next, the auxiliary material is removed from the second portions 6b of the working layer 1, whereby ridges 5 and trenches 6 emerge.

Next, the residual portions of the auxiliary photoresist 14 are removed.

Figure 4E:
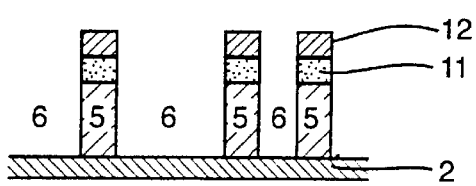

FIG. 4E represents the layer system after the removal of the auxiliary material and the auxiliary photoresist 14.

The structure on the base layer 2 is composed of the ridges 5, formed of the working material and which are covered by double-layered caps formed of the swellable processing material of the active processing sublayer 11 and the material of the passive processing sublayer 12, and the trenches 6 located between the ridges 5.

Next, the layer system is covered at least to the top edge of the active processing sublayer 11 with the processing liquid 8 containing a swelling agent.

The processing material incorporates the swelling agent at surfaces of the active processing sublayer 11 which are vertical relative to the base layer 2 and which are clear after the structuring.

Figure 4F:
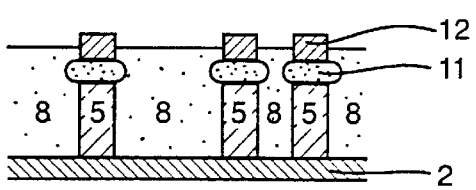

As represented in FIG. 4F, the processing material of the active processing sublayer 11 begins to expand parallel to the base layer 2 and to cover adjoining trenches 6 beginning at the surfaces of the ridges 5. Residual portions of the passive processing sublayer 12 thereon inhibit a swelling in the vertical direction, i.e. perpendicular to the base layer 2. The swelling agent that participates in the swelling process is contained in the processing liquid 8.

Figure 4G:
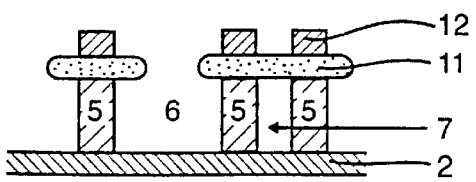

Trenches 6 with a width of less than a maximum cover width are covered as represented in FIG. 4G (right). The processing liquid 8 is removed from the cavities 7 that emerged with the covering of the trenches 6 in that it is expelled in gas form though the expanded portions of the active processing sublayer 11. As represented by the hatchings in FIG. 4G, residues of the residual portions of the passive processing sublayer 12 can still remain on the expanded portions of the active processing sublayer.

The expulsion occurs in a subsequent heating step wherein the expanded processing material is simultaneously cured.

A relief emerges which is formed of the base layer 2, the ridges 5, and the uncovered trenches 6, as well as expanded portions of the active processing layer 11, on which relief the cover layer 10 as represented in FIG. 1 formed of a dielectric material is then deposited.

Uncovered trenches 6 are thereby filled with the dielectric material of the cover layer 10 represented in FIG. 1.

EXAMPLE 1

FIGS. 3A–3G

The base layer 2 containing silicon nitride is deposited on the surface of a silicon wafer. Next, a copper layer with a thickness of 200 nm is sputtered onto the silicon nitride layer surface-wide. The copper layer corresponds to a compact, homogenous working layer 1 The working layer 1 is varnished with a swellable processing material. The swellable processing material forms an active processing sublayer 11 with a thickness of less than 100 nm.

The processing material is a CARL varnish which is rich in maleinanhydride (Clariant SZ694-K1).

The passive processing sublayer 12 containing an amorphous hydrocarbon (a-C:H) is deposited on the active processing sublayer 11. The active and passive processing sublayers 11, 12 together have a thickness of approximately 100 nm.

The auxiliary photoresist 14 is deposited on the processing sublayer surface-wide. The auxiliary photoresist 14 is an electron beam resist which is structured by a conventional lithography method.

During the development of the auxiliary photoresist 14, a maleinanhydride-rich photoresist of the active processing sublayer 11 is protected by the passive processing layer 12 (which contains an amorphous hydrocarbon) which is located between the auxiliary photoresist 14 and the active processing sublayer 11.

After the developing of the auxiliary photoresist 14, the structures of the auxiliary photoresist 14 are transferred into the passive and active processing sublayers 11, 12 by etching in oxygen plasma.

Next, the silicon dioxide between the copper ridges is etched out with a buffered fluorocarbon solution, so that there emerge on the silicon nitride layer free-standing copper ridges, which have triple-layer caps formed of the processing material, the a-C:H layer and the electron beam resist, and between these copper ridges, the trenches.

Next, the residual portions of the electron-beam resist is flood-lit and stripped in an alkaline developer.

The swelling process occurs as a silylation process. To this end, the silicon wafer is covered at least to the top edge of the active processing sublayer with a silylating solution as the processing liquid.

The swelling agent is incorporated through the maleinanhydride-rich varnish at the surfaces of the active processing sublayer facing the trenches, which surfaces were cleared by the etching in the oxygen plasma.

The active processing sublayer thus expands and covers the adjoining trenches.

Next, the silicon wafer is flushed with cyclohexane and heated for 20 minutes in a vacuum at 200 degrees Celsius.

Polymerization of the maleinanhydride-rich varnish is ended by the heating. At the same time, residues of the silylating solution are removed from cavities that emerged with the covering of the trenches.

Inspection by X-Ray Electron Beam Microscopy reveals that the 100 nm wide trenches are covered by the cured active processing sublayer, and thus cavities have emerged from the trenches.

A polybenoxazole is deposited over the polymerized processing layer as the cover layer 10. Vias to the copper ridges are subsequently etched by a conventional lithography technique, since the material of the cured processing layer and the material of the cover layer 10 are etchable by identical processes.

Once the vias are filled with a metal, a functional plane containing the base layer, the working layer (which functions as an interconnect layer), and a dielectric layer (which is formed of the polymerized processing layer and the cover layer) is closed on the silicon wafer.

Additional functional planes are similarly disposed on a functional plane of the silicon wafer.

EXAMPLE 2

FIGS. 4A–4G

A silicon nitride layer is deposited on the surface of a silicon wafer as the base layer 2. A silicon dioxide layer with a thickness of 200 nm is then deposited on the silicon nitride layer 2 and structured by electron beam lithography. Auxiliary trenches thus emerge in the silicon dioxide layer, which are 100 nm wide and 200 nm deep and which reach the silicon nitride layer.

Copper is sputtered onto the structures so created until at least the auxiliary trenches are wholly filled with copper. Next, copper that protrudes beyond the auxiliary trenches is ground to the top edge of the auxiliary trenches.

A compact prestructured working layer emerges, in which the future copper ridges are fully developed, and silicon dioxide is located between the ridges as an auxiliary agent. On the surface of the working layer opposite the silicon nitride layer, a working surface is constructed, which is composed, in sections, of the surfaces of the copper ridges and the surfaces of the trenches that are filled with silicon dioxide.

The working layer 1 is varnished with a swellable processing material. The swellable processing material forms the active processing sublayer 11. The processing material is a maleinanhydride-rich CARL varnish (Clariant SZ594-K1).

The passive processing sublayer 12 of an amorphous hydrocarbon (a-C:H) is deposited on the active processing sublayer 11. The active and passive processing sublayers 11, 12 together have a thickness of approximately 100 nm.

The auxiliary photoresist 14 is deposited on the processing sublayer surface-wide. The auxiliary photoresist 14 is an electron beam resist which is structured by a lithography technique.

During the developing and potential silylating and/or reinforcing of the auxiliary photoresist 14, the maleinanhydride-rich photoresist of the active processing sublayer 11 is protected by the passive processing sublayer 12 (which is formed of amorphous hydrocarbon) between the auxiliary photoresist 14 and the active processing sublayer 11.

After the developing of the auxiliary photoresist 14, the structures of the auxiliary photoresist 14 are transferred into the passive and active processing sublayers 11, 12 by etching in an oxygen plasma.

Next, the silicon dioxide between the copper ridges is etched out with a buffered fluorocarbon solution, so that there emerge on the silicon nitride layer free-standing copper ridges, which are covered with triple-layer caps containing the processing material, the a-C:H layer and the electron beam resist, and between the copper ridges 5, the trenches 6.

Next, the residual portions of the electron beam resist are flood-lit and stripped in an alkaline developer.

The swelling process occurs as a silylation process. To this end, the silicon wafer is covered at least to the top edge of the active processing sublayer with a silylating solution as the processing liquid.

The swelling agent is incorporated through the maleinanhydride-rich varnish at the surfaces of the active processing sublayer facing the trenches, which surfaces were cleared by the etching in oxygen plasma.

The active processing sublayer thus expands and covers the adjoining trenches.

Next, the silicon wafer is flushed with cyclohexane and heated for 20 minutes in a vacuum at 200 degrees Celsius.

A polymerization of the maleinanhydride-rich varnish is ended by the heating. At the same time, residues of the silylating solution are removed from cavities that emerged with the covering of the trenches.

We claim:

1. A method for creating structured cavities in a cavity layer of a semiconductor device, which comprises the steps of:

providing a base layer;

depositing a working layer formed from a working material at least in sections on the base layer, the working layer being initially in the form of a compact working layer;

depositing a processing layer on the working layer resulting in a double-layer containing the working layer and the processing layer, the processing layer containing at least one active processing sublayer having a swellable processing material;

structuring the double-layer resulting in ridges with sub-micrometer dimensions being formed and with trenches being formed between the ridges, the ridges containing the working material and covered by the swellable processing material;

providing a processing liquid containing a swelling agent that can be incorporated into the swellable processing material;

controlling an incorporation of the swelling agent into the swellable processing material, resulting in the swellable processing material of the ridges swelling, and consequently the trenches between adjacent ones of the ridges being covered and defining cavities there beneath; and removing processing residues from the cavities.

2. The method according to claim 1, which comprises constructing the base layer as an etch stop layer.

3. The method according to claim 1, which comprises using a conductive material as the working material.

4. The method according to claim 1, which comprises forming the trenches down to the base layer.

5. The method according to claim 1, which comprises:

depositing the working layer as a homogenous layer containing the working material; and structuring the double layer by the steps of:
structuring the processing layer; and
imaging the structure of the processing layer onto the working layer.

6. The method according to claim 1, which comprises:

forming the working layer with first portions formed from the working material and, between the first portions, second portions formed from an auxiliary material; and structuring the double layer by the steps of:

structuring the processing layer such that residual portions of the swellable processing material remain exclusively on portions of a surface of the working layer formed by the first portions of the working layer; and removing the auxiliary material.

7. The method according to claim 5, which comprises:

providing the processing layer as a processing double layer formed of the active processing sublayer containing the swellable processing material and a passive processing sublayer disposed on the active processing sublayer; and structuring the double layer by the steps of:

depositing an auxiliary photoresist on the double layer;

structuring the auxiliary photoresist; and imaging a structure of the auxiliary photoresist onto the processing layer.

8. The method according to claim 7, which comprises forming the passive processing sublayer as a layer of amorphous hydrocarbon.

9. The method according to claim 7, which comprises removing residual portions of the auxiliary photoresist remaining after the structuring of the auxiliary photoresist during the structuring of the working layer.

10. The method according to claim 1, which comprises using a pyrolizable material as the swellable processing material.

11. The method according to claim 10, which comprises pyrolizing the pyrolizable material at an initial temperature.

12. The method according to claim 1, which comprises using a curable polymer as the swellable processing material.

13. The method according to claim 12, which comprises curing the curable polymer at a given temperature.

14. The method according to claim 12, which comprises using a polyimide prestage as the swellable processing material.

15. The method according to claim 1, which comprises forming the swellable processing material from carboxylic acid anhydride groups.

16. The method according to claim 1, which comprises using a silylating agent as the swelling agent.

17. The method according to claim 13, which comprises expelling the processing residues from the cavities at an initial temperature.

18. The method according to claim 17, which comprises setting the initial temperature and the given temperature to be equal.

19. The method according to claim 1, which comprises depositing a cover layer formed of a dielectric material on the processing layer after the processing residues are removed.

20. The method according to claim 19, which comprises forming the dielectric material to be a material which can be removed together with material of the processing layer.

21. The method according to claim 6, which comprises:

providing the processing layer as a processing double layer formed of the active processing sublayer containing the swellable processing material and a passive processing sublayer disposed on the active processing sublayer; and structuring the double layer by the steps of:

depositing an auxiliary photoresist on the double layer;

structuring the auxiliary photoresist; and imaging a structure of the auxiliary photoresist onto the processing layer.

22. The method according to claim 21, which comprises forming the passive processing sublayer as a layer of amorphous hydrocarbon.

23. The method according to claim 21, which comprises removing residual portions of the auxiliary photoresist remaining after the structuring of the auxiliary photoresist during the structuring of the working layer.

* * * * *